United States Patent [19]
Jen

[11] Patent Number: 5,753,073
[45] Date of Patent: *May 19, 1998

[54] HIGH SELECTIVITY NITRIDE TO OXIDE ETCH PROCESS

[75] Inventor: Jang Jen, San Jose, Calif.

[73] Assignee: Integrated Device Technology, Inc., Santa Clara, Calif.

[*] Notice: The term of this patent shall not extend beyond the expiration date of Pat. No. 5,672,242.

[21] Appl. No.: 611,960

[22] Filed: Mar. 7, 1996

Related U.S. Application Data

[63] Continuation-in-part of Ser. No. 594,930, Jan. 31, 1996, Pat. No. 5,672,242.
[51] Int. Cl.$^6$ ................................................. H01L 21/306
[52] U.S. Cl. ........................................ 156/643.1; 156/657.1
[58] Field of Search .......................... 156/643.1, 657.1, 156/659.11

[56] References Cited

U.S. PATENT DOCUMENTS 4,484,979  11/1984  Stocker ........................ 156/659.11

Primary Examiner—R. Bruce Breneman
Assistant Examiner—Anita Alanko
Attorney, Agent, or Firm—Skjerven, Morrill, MacPherson, Franklin, & Friel

[57] ABSTRACT

The process parameters according to which the AMT 8310 RIE plasma etcher operates are altered so as to increase the nitride to oxide selectivity of the AMT 8310 RIE plasma etcher from approximately 3:1 to approximately 5:1, thereby allowing for the fabrication of modern semiconductor devices having oxide films significantly less thick than 325 Å. In this manner, the present invention eliminates the need for an expensive upgrade in etching equipment to realize an increase in nitride to oxide selectivity.

7 Claims, 3 Drawing Sheets

HIGH SELECTIVITY NITRIDE TO OXIDE ETCH PROCESS

CROSS-REFERENCE TO RELATED APPLICATION

This application is a continuation-in-part of U.S. patent application Ser. No. 08/594,930, U.S. Pat. No. 5,672,242 entitled "HIGH SELECTIVITY NITRIDE TO OXIDE ETCH PROCESS" filed on Jan. 31, 1996, and assigned to the assignee of the present invention.

BACKGROUND

1. Field of the Invention

The present invention relates generally to plasma etching techniques and specifically to a plasma etching process having an increased etching selectivity between films.

2. Description of Related Art

In a typical process for the fabrication of an integrated circuit, as shown in FIGS. 1 and 2, a layer 12 of oxide is first formed on the top surface of a silicon wafer 10. Oxide layer 12, which may be used to stop the etching of a subsequently formed nitride layer and thereby protects wafer 10 from damage caused by etchant used in the subsequent formation of integrated circuits on wafer 10, is approximately 325 Å thick. A nitride layer 14 approximately 1500 Å is then formed over oxide layer 12. A layer of photo-resist 16 is then spun on the top surface of nitride layer 14.

After photo-resist layer 16 is patterned using conventional techniques, as shown in FIG. 1, portions of nitride layer 14 exposed by the patterned photo-resist layer 16 are removed using a plasma etching machine. One such machine is the AMT 8310 Reactive Ion Etchant (RIE) Plasma etcher available from Applied Materials, as shown in FIG. 2. The standard AMT 8310 etching process has a nitride-to-oxide selectivity of approximately 3:1, i.e., when using the AMT 8310 process, nitride layer 14 is etched at approximately 3 times the rate at which oxide layer 12 is etched. The standard process parameters used with the AMT 8310 are listed below in Table 1.

TABLE 1

| parameter | value |
| --- | --- |
| pressure | 50 mTorr |
| power | 1800 Watts |
| electrical bias | 550 Volts |
| Freon 23 | 90 SCCM |
| Oxygen | 60 SCCM |

It is important when etching away nitride layer 14 that a minimal amount of oxide layer 12 is removed. Should a sufficient portion of oxide layer 12 be inadvertently etched away during removal of nitride layer 14, devices (not shown) subsequently formed within wafer 10 may suffer from punch-through, leakages, and/or well known other reliability problems.

As integrated circuits become smaller, the films used therein have become thinner and thinner. Recent semiconductor devices utilize oxide layers of only approximately 150–200 Å thick. As a result of using such thinner oxide films, RIE plasma etchers including the AMT 8310 described above are not able to effectively remove all of the exposed portions of nitride layer 14 with a sufficiently precise over-etch to compensate for variations in the etchant rate and in the thickness of nitride layer 14 without also completely removing underlying portions of oxide layer 12. Accordingly, the reduction in thickness of oxide layer 12 from approximately 325 Å to approximately 150–200 Å requires a corresponding increase in selectivity of the plasma etcher in order to avoid inadvertently removing the oxide film 12.

SUMMARY

An etching process for use with plasma etchers including the AMT 8310 RIE plasma etcher is disclosed herein which significantly increases the nitride to oxide selectivity of the etch process over the selectivity of a prior art process used to etch the same materials. In one embodiment this invention achieves a nitride to oxide selectivity of approximately 5:1. In accordance with the present invention, the process parameters are altered so as to result in the AMT 8310 RIE plasma etcher having a nitride to oxide selectivity of greater than 3 and, in some circumstances, approximately 5:1, thereby allowing the AMT 8310 RIE plasma etcher to be used in the fabrication of advanced semiconductor devices having oxide films significantly less thick than 325 Å. Thus, the present invention eliminates the need for an expensive upgrade in etching equipment to manufacture semiconductor devices with submicron dimensions on the order of 0.35 microns or less, for example.

DETAILED DESCRIPTION

As mentioned above, the use of thinner oxide films in the fabrication of modern semiconductor devices has resulted in a need for higher selectivities when etching away nitride layer 14. When oxide layer 12 is of a thickness on the order of 300 Å, a 3:1 nitride to oxide selectivity is acceptable. Note, however, that as the thickness of oxide layer 12 is reduced to 200 Å and below, error tolerances become much tighter. Indeed, etching away nitride layer 14 using an AMT 8310 plasma etcher having a selectivity of 3:1 is likely to undesirably result in the complete removal of oxide layer 12 underlying exposed portions of nitride layer 14.

Applicant has found that the selectivity of the AMT 8310 RIE plasma etcher may be improved from less than 3:1 to as high as 5:1 by changing the process parameters. Thus, while using the AMT 8310 in accordance with the process parameters listed above in Table 1 results in nitride layer 14 being etched at approximately 700 Å/min and oxide layer 12 being etched at approximately 250 Å/min, operating the AMT 8310 RIE plasma etcher within the range of process parameters listed below in Table 2 allows the etch rates to be controlled so as to achieve a selectivity anywhere between approximately 3.0 and approximately 5.0.

TABLE 2

| parameter | value |
| --- | --- |
| pressure | 40–60 mTorr |
| power | 600–1200 Watts |
| electrical bias | 100–300 Volts |
| Freon | 70–100 SCCM |
| Oxygen | 60–90 SCCM |

Figure 1:
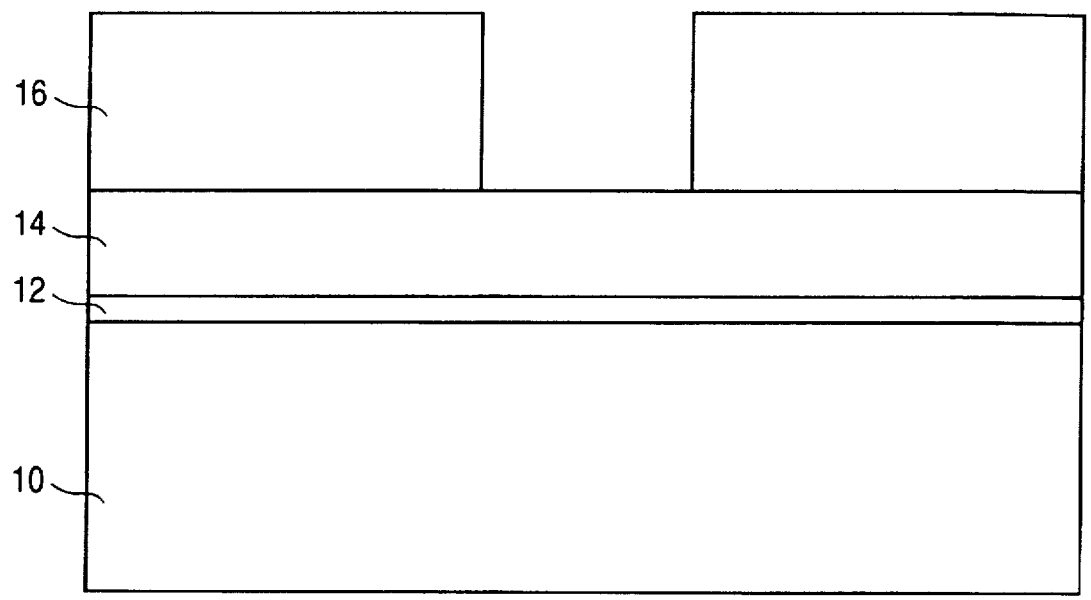
FIGS. 1 and 2 illustrate early process steps in the fabrication of an integrated circuit.
Figure 2:
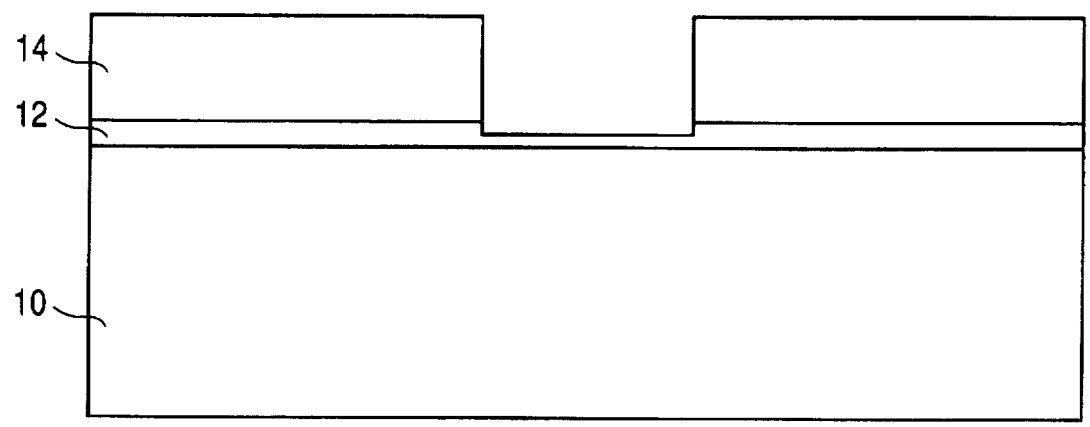
Figure 3:
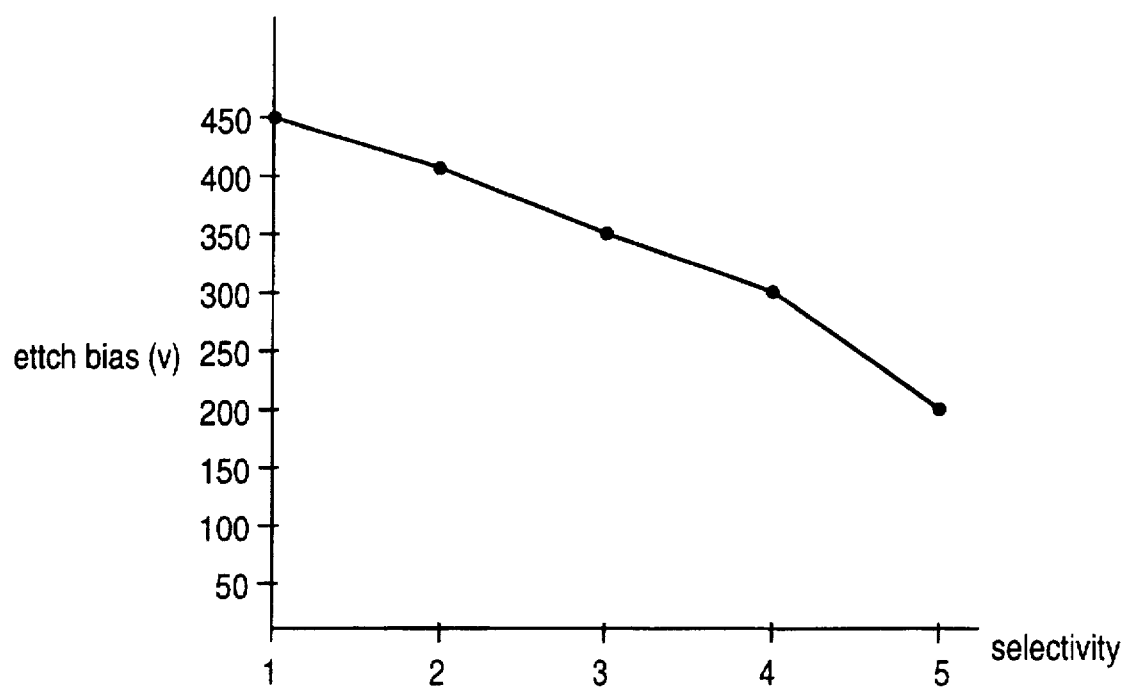
FIGS. 3 and 4 are plots of etch bias voltage versus nitride-to-oxide selectivity for constant oxygen flow rates of 90 SCCM and 105 SCCM, respectively.
Figure 4:
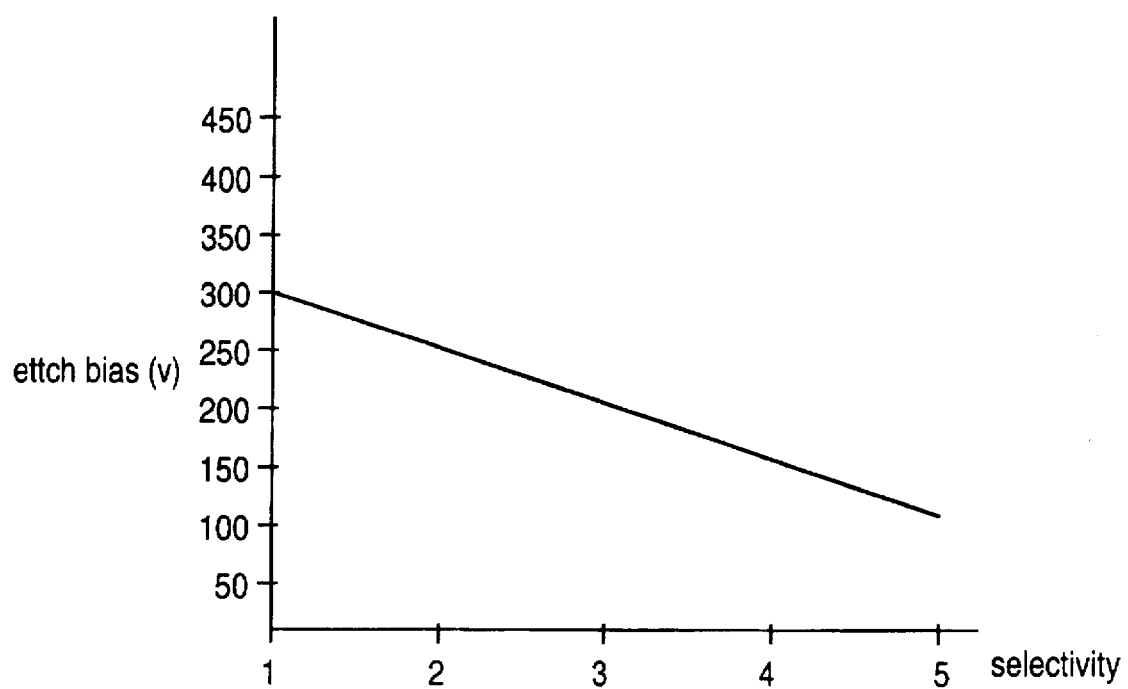
Figure 5:
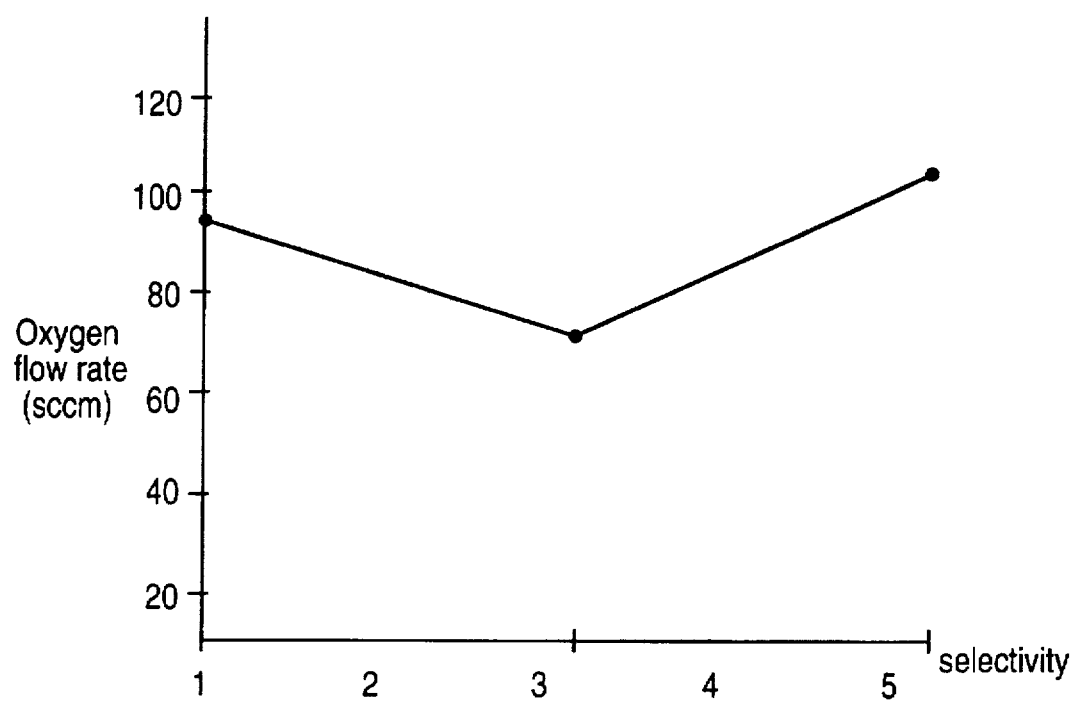
FIG. 5 is a plot of oxygen flow rate versus nitride-to-oxide selectivity for a constant etch bias voltage of −150V.

FIGS. 3 and 4 illustrate the relationship between the etch bias voltage and nitride-to-oxide selectivity at constant oxygen flows of 90 SCCM and 105 SCCM, respectively, and FIG. 5 shows the relationship between oxygen flow rate and nitride-to-oxide selectivity at a constant etch bias voltage of −150V. Note that at oxygen flow rates of both 90 and 105 SCCM, the nitride-to-oxide selectivity steadily increases as the etch bias voltage is decreased. However, as the etch bias voltage drops below approximately −100V, the etch bias voltage becomes insufficient to facilitate proper etching of nitride. As a result, nitride layers that are to be etched begin to accumulate some of the etchant material, thereby effectively decreasing the nitride-to-oxide selectivity. Table 3 indicates nitride-to-oxide selectivities achieved for various combinations of etch bias voltages and oxygen gas flow rates.

TABLE 3

| Oxygen Flow (SCCM) | Etch Bias (V) | Nitride-to-Oxide Selectivity |
|---|---|---|
| 90 | 450 | 2.98 |
| 90 | 400 | 2.82 |
| 90 | 350 | 3.17 |
| 90 | 300 | 3.47 |
| 90 | 150 | 4.35 |
| 90 | 150 | 4.47 |
| 75 | 150 | 4.92 |
| 105 | 150 | 4.30 |
| 105 | 300 | 3.40 |
| 105 | 250 | 3.37 |
| 105 | 200 | 3.56 |
| 105 | 150 | 3.81 |
| 105 | 100 | 3.08 |

Applicant has found that when operating within the ranges listed in Table 2, the AMT 8310 may etch away nitride layer 14 at a rate of up to approximately 200 Å/min while etching away oxide layer 12 at a rate of approximately 40 Å/min, thereby achieving a nitride to oxide selectivity of approximately 5:1 (i.e., shown in Table 3 as 4.92:1). After etching away nitride layer 14 as described above, an over-etch step may be required to compensate for non-uniformities in nitride layer 14.

This increased selectivity allows the AMT 8310 to be used in the fabrication of advanced semiconductor devices having oxide film thicknesses less than 200 Å. Without such improved selectivity, etchants used to remove portions of an overlying nitride layer may inadvertently remove sufficient portions of the oxide layer so as to render the oxide layer ineffective. Note that since the increased selectivity achieved by the present invention is realized by reducing the etching rate of the AMT 8310 etcher, operating the AMT 8310 in accordance with the present invention results in a 10–20% decrease in throughput as compared to operating the AMT 8310 in accordance with the process parameters listed in Table 1.

While particular embodiments of the present invention have been shown and described, it will be obvious to those skilled in the art that various changes and modifications may be made without departing from this invention in its broader aspects and, therefore, the appended claims encompass all such changes and modifications as fall within the true spirit and scope of this invention.

What is claimed is:

1. A method for etching away portions of a nitride layer without significantly etching away an underlying oxide layer in a semiconductor device, said method comprising the steps of:

electrically biasing said semiconductor device at a bias voltage; and providing Freon and Oxygen gases at first and second flow rates, having a ratio between approximately 0.75 and 1.75 respectively, over a top surface of said nitride layer to remove said nitride layer at a first rate and to remove said oxide layer at a second so as to achieve a nitride-to-oxide selectivity greater than approximately 3:1.

2. The method of claim 1 wherein said gases are provided over said top surface of said nitride layer at a pressure in a range of approximately 40–60 mTorr.

3. The method of claim 1 wherein said first flow rate is in a range of approximately 70–100 SCCM.

4. The method of claim 1 wherein said second flow rate is approximately 60–90 SCCM.

5. The method of claim 1 wherein said gases are provided over said top surface of said nitride layer using a plasma etcher, said plasma etcher being operated at approximately 600–1200 Watts.

6. The method of claim 1 wherein said first bias voltage is in a range of approximately 100–300 volts.

7. The method of claim 1 wherein said second flow rate is approximately 90 SCCM and said bias voltage is approximately −150 volts such that said first and second rates are approximately 200 Å/min and approximately 40 Å/min, respectively.

* * * * *

UNITED STATES PATENT AND TRADEMARK OFFICE
CERTIFICATE OF CORRRECTION

PATENT NO. : 5,753,073
DATED : May 19, 1998
INVENTOR(S) : Jen

It is certified that error appears in the above-identified patent and that said Letters Patent is hereby corrected as shown below:

On the title page, item [56] insert the following

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 5 | 4 | 3 | 1 | 7 | 7 | 2 | 07/11/95 | Babie et al. | | | |
| | | 5 | 3 | 5 | 6 | 5 | 1 | 5 | 10/18/94 | Tahara et al. | | | |
| | | 5 | 0 | 8 | 6 | 0 | 1 | 1 | 02/04/92 | Shiota | | | |
| | | 4 | 2 | 1 | 4 | 9 | 4 | 6 | 07/29/80 | Forget et al. | | | |
| | | 5 | 4 | 6 | 8 | 3 | 4 | 2 | 11/21/95 | Nulty et al. | | | |
| | | 4 | 8 | 3 | 6 | 8 | 8 | 7 | 06/06/89 | Daubenspeck et al. | | | |
| | | 5 | 3 | 7 | 1 | 0 | 3 | 5 | 12/06/94 | Pfiester et al. | | | |
| | | 4 | 5 | 3 | 8 | 3 | 4 | 3 | 09/03/85 | Pollack et al. | | | |

UNITED STATES PATENT AND TRADEMARK OFFICE
CERTIFICATE OF CORRRECTION

PATENT NO. : 5,753,073
DATED : May 19, 1998
INVENTOR(S) : Jen

It is certified that error appears in the above-identified patent and that said Letters Patent is hereby corrected as shown below:

On the title page, item [56] insert the following

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | 5 | 0 | 1 | 7 | 9 | 9 | 9 | 05/21/91 | Roisen et al. | | | |
| | 4 | 9 | 6 | 6 | 8 | 7 | 0 | 10/30/90 | Barber et al. | | | |
| | 4 | 9 | 7 | 8 | 4 | 2 | 0 | 12/18/90 | Bach | | | |
| | 5 | 5 | 7 | 3 | 5 | 9 | 7 | 11/12/96 | Lantsman | | | |
| | 4 | 5 | 9 | 5 | 4 | 8 | 4 | 06/17/86 | Giammarco et al. | | | |
| | 5 | 6 | 1 | 1 | 8 | 8 | 8 | 03/18/97 | Bosch et al. | | | |
| | 5 | 6 | 0 | 5 | 6 | 3 | 7 | 02/25/97 | Shan et al. | | | |
| | 5 | 1 | 4 | 7 | 5 | 0 | 0 | 09/15/92 | Tachi et al. | | | |
| | | | | | | | | | | | | |

UNITED STATES PATENT AND TRADEMARK OFFICE
CERTIFICATE OF CORRRECTION

PATENT NO. : 5,753,073
DATED : May 19, 1998
INVENTOR(S) : Jen

It is certified that error appears in the above-identified patent and that said Letters Patent is hereby corrected as shown below:

On the title page, item [56] insert the following

OTHER DOCUMENTS

| | | |
|---|---|---|
| | "Plasma Etch: A Matter of Fine-Tuning," Semiconductor International, December 1995. | |
| | pp 65-68 | |
| | | |

Signed and Sealed this

Sixth Day of April, 1999

Attest:

Attesting Officer

Q. TODD DICKINSON

Acting Commissioner of Patents and Trademarks